(12) United States Patent
Vummintala et al.

(10) Patent No.: US 9,008,734 B2
(45) Date of Patent: Apr. 14, 2015

(54) WIRELESS COMMUNICATION DEVICE HAVING REDUCED POWER CONSUMPTION

(75) Inventors: Shashidhar Vummintala, Bangalore (IN); Gowrisankar Somichetty, Bangalore (IN); Sriram Rajagopal, Bangalore (IN); Sindhu Verma, Bangalore (IN); Manish Airy, Bangalore (IN); Hariprasad Gangadharan, Bangalore (IN); Ramasamy Palanisamy Pugazhanthi, Bangalore (IN); Felix Varghese, Bangalore (IN); Erik Stauffer, Mountain View, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/309,290

(22) Filed: Dec. 1, 2011

(65) Prior Publication Data
US 2013/0130751 A1 May 23, 2013

Related U.S. Application Data

(60) Provisional application No. 61/562,196, filed on Nov. 21, 2011.

(51) Int. Cl.
*H04B 1/00* (2006.01)
*H04W 4/00* (2009.01)
*H04W 52/02* (2009.01)

(52) U.S. Cl.
CPC .................................. *H04W 52/0216* (2013.01)

(58) Field of Classification Search
USPC .......... 455/273, 3.02, 130, 574, 68; 370/310, 370/311, 338, 329; 713/320
See application file for complete search history.

(56) References Cited

U.S. PATENT DOCUMENTS

| | | | | |
|---|---|---|---|---|
| 8,462,746 | B2* | 6/2013 | Bitran et al. | 370/338 |
| 2003/0203722 | A1* | 10/2003 | Karlquist et al. | 455/130 |
| 2004/0172566 | A1* | 9/2004 | Greiger et al. | 713/320 |
| 2006/0126545 | A1* | 6/2006 | Nanda | 370/310 |
| 2008/0219198 | A1* | 9/2008 | Honkasalo et al. | 370/311 |
| 2008/0240022 | A1* | 10/2008 | Yoon et al. | 370/329 |
| 2009/0170424 | A1* | 7/2009 | Malkemes et al. | 455/3.02 |
| 2010/0093288 | A1* | 4/2010 | Pan et al. | 455/68 |
| 2010/0284379 | A1* | 11/2010 | Bitran et al. | 370/338 |
| 2011/0235764 | A1* | 9/2011 | Ware et al. | 375/362 |

FOREIGN PATENT DOCUMENTS

WO   WO 2010/080176   *   7/2010   ........... G11C 11/407

* cited by examiner

*Primary Examiner* — William Nealon
(74) *Attorney, Agent, or Firm* — Sterne, Kessler, Goldstein & Fox PLLC (57) ABSTRACT

A wireless communication device is disclosed that is capable of reduced power consumption. Uplink and downlink subframes in a WiMAX, 802.16m or LTE environment often include several vacant symbols during which power-hungry hardware and software components need not operate at full power. By analyzing a physical layer beacon and control information of a received signal, the specific locations of data bursts can be determined, as well as periods of needed operation of a receiver module to effectively decode those data bursts. The receiver module can otherwise be controlled to operate in a LOW power state during remaining periods of vacant time, thereby conserving power consumption and extending battery life.

20 Claims, 10 Drawing Sheets

WIRELESS COMMUNICATION DEVICE HAVING REDUCED POWER CONSUMPTION

CROSS REFERENCE TO RELATED APPLICATIONS

This application claims the benefit of U.S. Provisional Patent Application 61/562,196 entitled "Fourth Generation (4G) Communications Systems," filed Nov. 21, 2011.

BACKGROUND

1. Field of Invention

The invention relates to wireless communications, and more specifically to a wireless communication device that is capable of reduced power consumption.

2. Related Art

Wireless communication devices, such as cellular telephones to provide an example, are becoming commonplace in both personal and commercial settings. The wireless communication devices provide users with access to all kinds of information. For example, a user can access the internet through an internet browser on the device, download miniature applications (e.g., "apps") from a digital marketplace, send and receive emails, or make telephone calls using a voice over internet protocol (VoIP). Consequently, wireless communication devices provide users with significant mobility, while allowing them to remain "connected" to communication channels and information.

Wireless communication devices communicate with one or more other wireless communication devices or wireless access points to send and receive data. Typically, a first wireless communication device generates and transmits a radio frequency signal modulated with encoded information. This radio frequency signal is transmitted into a wireless environment and is received by a second wireless communication device. The second wireless communication device demodulates and decodes the received signal to obtain the information. The second wireless communication device may then respond in a similar manner. The wireless communication devices can communicate with each other or with access points using any well-known modulation scheme, including but not limited to amplitude modulation (AM), simple frequency modulation (FM), quadrature amplitude modulation (QAM), phase shift keying (PSK), quadrature phase shift keying (QPSK), and/or orthogonal frequency-division multiplexing (OFDM), as well as any other communication scheme that is now, or will be, known, or any combination thereof.

Over the years, in an effort to make wireless communication devices more portable, wireless communication devices have shrunk in both size and weight. As a consequence of portability, such devices must rely on a limited power supply (i.e., a battery) despite becoming increasingly complex and power-hungry, and must maintain low heat dissipation for handheld and travel use. Thus, significant efforts have been made to reduce power consumption in wireless communication devices in order to maximize battery life and reduce heat dissipation.

As portable devices have shrunk, power consumption has been reduced primarily by reducing operating voltages of digital components, and by converting power-inefficient analog components to similar digital components. However, many analog components, such as radio receivers/transmitters and analog front-ends (AFE), do not scale with technology and cannot be converted into digital components—or can only be converted with significant performance sacrifices. For example, an analog radio receiver operates at full-power even under good signal conditions because there is no way to predict operating conditions that would enable reduced operating power.

Consequently, there is a need for a wireless communication device that can effectively further reduce power consumption without sacrificing performance. Further aspects and advantages of the invention will become apparent from the detailed description that follows.

BRIEF DESCRIPTION OF THE DRAWINGS/FIGURES

Embodiments of the invention are described with reference to the accompanying drawings. In the drawings, like reference numbers indicate identical or functionally similar elements. Additionally, the left most digit(s) of a reference number identities the drawing in which, the reference number first appears.

The invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

Embodiments of the invention may be implemented in hardware (e.g., circuits), firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Although the description of the present invention is to be described in terms of wireless communication (specifically cellular communication), those skilled in the relevant art(s) will recognize that the present invention may be applicable to other communications that use wired or other wireless communication methods without departing from the spirit and scope of the present invention.

An Exemplary Wireless Communications Environment

Figure 1:
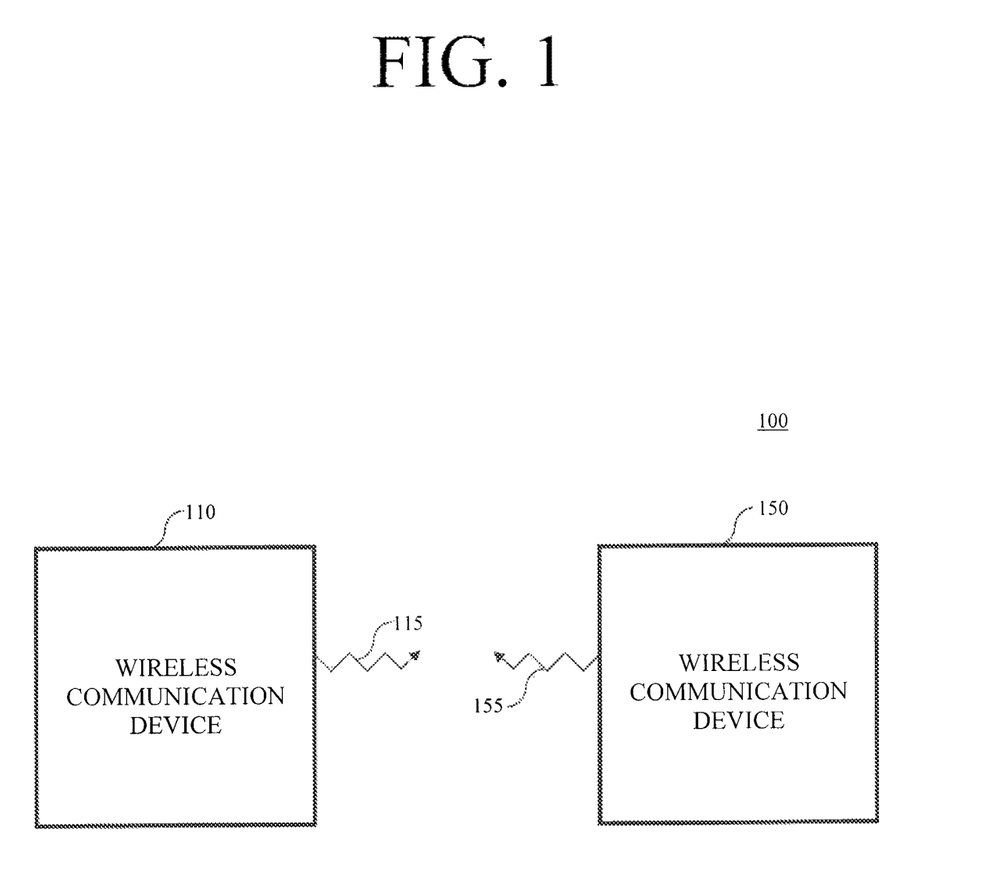
FIG. 1 illustrates a block diagram of a wireless communication environment according to an exemplary embodiment of the invention.

FIG. 1 illustrates a block diagram of a wireless communication environment 100 according to an exemplary embodiment of the invention. The wireless communication environment 100 provides wireless communication of information, such as one or more commands and/or data, between wireless communication devices. The wireless communication devices may each be implemented as a standalone or a discrete device, such as a mobile telephone, or may be incorporated within or coupled to another electrical device or host device, such as a portable computing device, a camera, or a Global Positioning System (GPS) unit or another computing device such as a personal digital assistant, a video gaming device, a laptop, a desktop computer, or a tablet, a computer peripheral such as a printer or a portable audio and/or video player to provide some examples and/or any other suitable electronic device that will be apparent to those skilled in the relevant art(s) without departing from the spirit and scope of the invention.

The exemplary wireless communication environment 100 includes a first wireless communication device 110 and a second wireless communication device 150. The first wireless communication device 110 may represent an exemplary embodiment of a mobile subscriber and the second wireless communication device 150 may represent an exemplary embodiment of a base station within a cellular communications network.

The first wireless communication device 110 transmits a first wireless signal 115 toward the second wireless communication device 150 using any acceptable modulation scheme. The second wireless communication device 150 receives the first wireless signal 115. The second wireless communication device 150 processes the received first communication signal and, if necessary, transmits a second wireless signal 155 back to the first wireless communication device 110. In this manner, the first wireless communication device 110 and the second wireless communication device 150 exchange information ("communicate") with one another.

An Exemplary Wireless Communication Device

Figure 2:
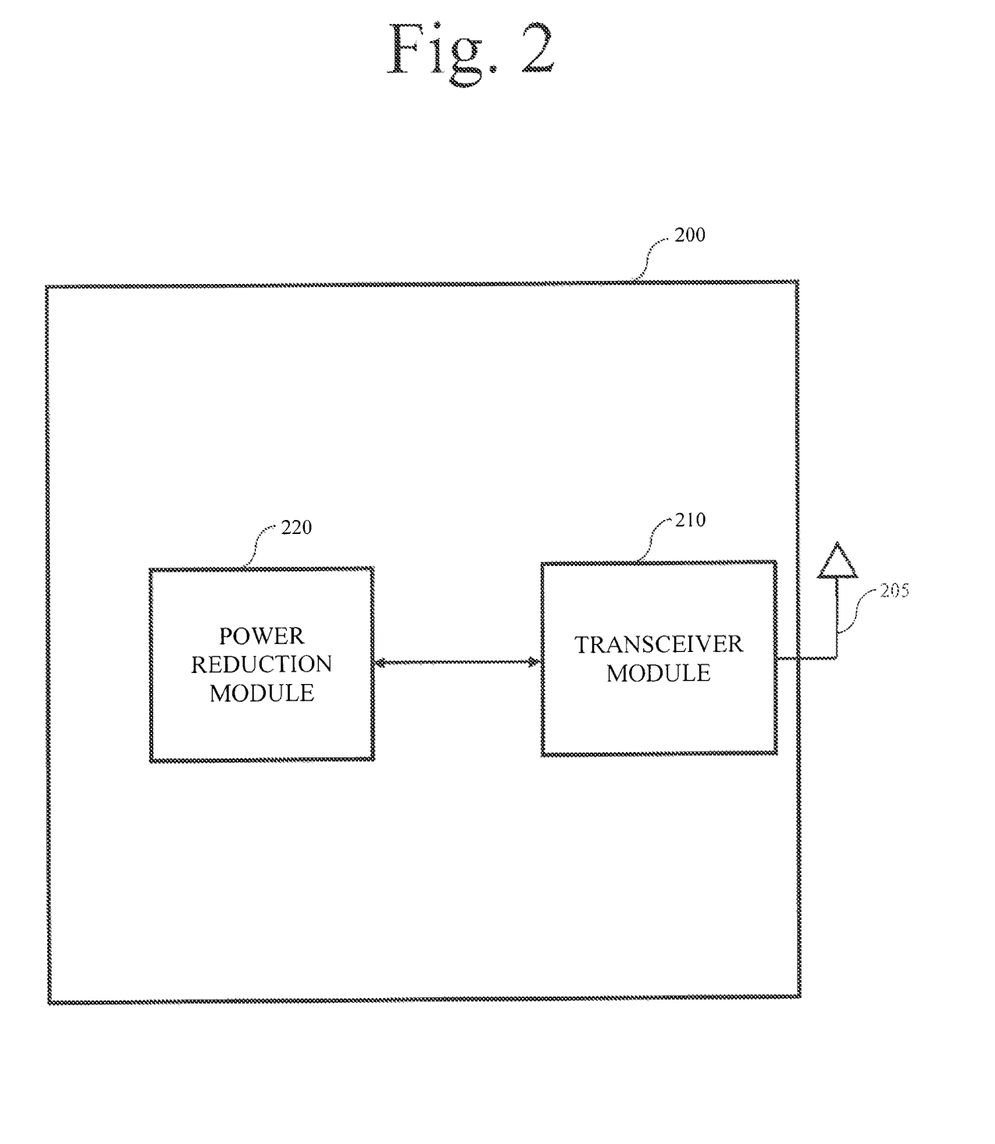
FIG. 2 illustrates a block diagram of a wireless communication device that is implemented as part of the wireless communication environment according to an exemplary embodiment of the invention.

FIG. 2 illustrates a block diagram of a wireless communication device 200 that is implemented as part of the wireless communication environment 100 according to an exemplary embodiment of the invention. The wireless communication device 200 includes a power reduction module 220, and may represent an exemplary embodiment of the first wireless communication device 110.

The wireless communication device 200 includes an antenna 205 that receives a signal from, or transmits a signal to, the wireless communication environment 100. For simplicity of discussion, the invention will be described in terms of receiving a signal, and performing various functions based on the received signal. However, those skilled in the relevant art(s) will recognize that similar operations can be performed for signal transmission to achieve substantially similar results.

The antenna 205 forwards the received signal to a transceiver module 210. The transceiver module 210 includes several components used in signal transmission/reception and for performing various operations on the received signal. After receiving the signal from the wireless communication environment 100, the transceiver module 210 forwards the received signal to the power reduction module 220.

The power reduction module 220 performs various operations on the received signal, and controls the power consumed by the components of the transceiver module 210 based on the received signal so as to reduce overall power consumption of the wireless communication device 200.

An Exemplary Wireless Communication Device

Figure 3:
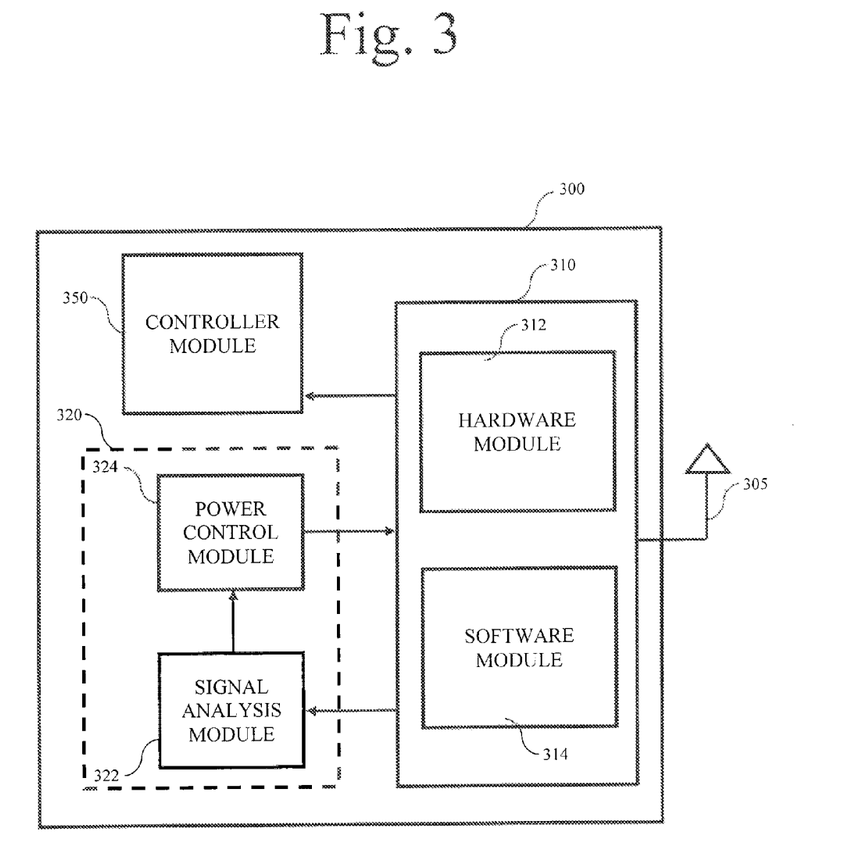
FIG. 3 illustrates a block diagram of a wireless communication device that is implemented as part of the wireless communication environment according to an exemplary embodiment of the invention.

FIG. 3 illustrates a block diagram of a wireless communication device 300 that is implemented as part of the wireless communication environment 100 according to an exemplary embodiment of the invention. The wireless communication device 300 includes a transceiver module 310 and a power reduction module 320, and may represent an exemplary embodiment of the wireless communication device 200.

An antenna 305 receives a signal from the wireless communication environment 100 and forwards the received signal to the transceiver module 310. As discussed above, the transceiver module 310 includes several components related to receiving/transmitting signals, and for performing various operations on the signals. These components include one or more of each of a radio (RF), Analog Front-End (AFE), sample processing (SP) unit, channel estimation (CE) unit, demodulator, decoder, and physical measurement unit. The AFE includes analog-to-digital converters (ADCs) and digital-to-analog converters (DACs) for converting incoming and outgoing signals, respectively. The SP unit performs time-domain processing, and also Fast Fourier Transform (FFT) for OFDM/A systems. The physical measurement unit performs measurements for various physical conditions, such as carrier-to-noise plus interference ratio (CINR), Doppler, and channel quality information.

The components of the transceiver module 310 may be implemented as hardware components, as software components, or as some combination thereof. Therefore, the transceiver module 310 includes a hardware module 312 containing the hardware components of the transceiver module 310, and a software module 314 containing the software components of the transceiver module 314, executable by an appropriate processor including a digital signal processor (DSP). Each of these components consumes certain amounts of power for full operation. Many of the hardware components are capable of entering a low-power state (e.g., an off state), at the cost of performance, whereas many of the software components (and their corresponding processor) are capable of terminating, or temporarily suspending, operations so as to consume less power. For example, code can be suspended, or put in low power routine, so that the power draw of the corresponding processor can be reduced. However, it is desirable that these components should be controlled to enter these low-power states when doing so will not adversely affect signal communication.

Figure 4A:
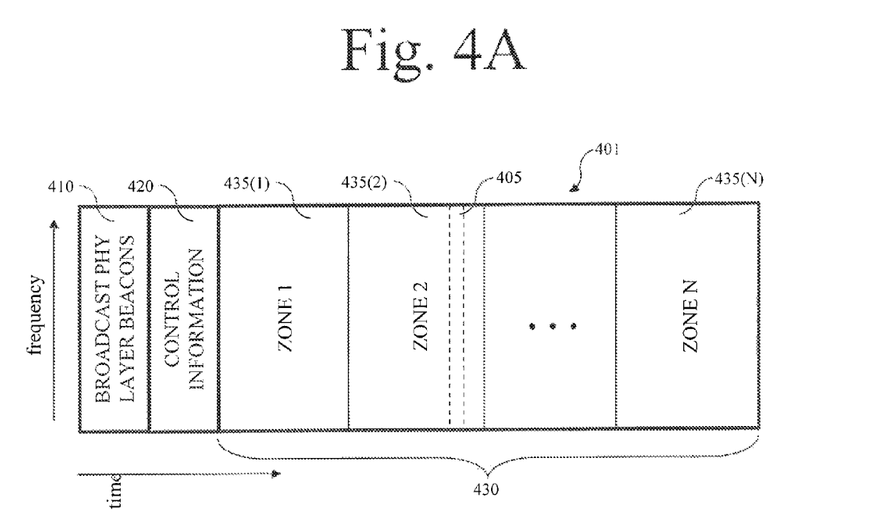
FIG. 4A illustrates a signal received or transmitted by the wireless communication device according to an exemplary embodiment of the invention.

FIG. 4A illustrates a signal 401 received or transmitted by the wireless communication device 300 according to an exemplary embodiment of the invention. The signal 401 generally represents a general Time Division Duplex (TDD) data frame/sub-frame that may be used by any WiMAX, 802.16m, or LTE communication standard, the standards of which are each incorporated herein in their entirety by reference. It will be understood that similar principles as those discussed below can also be applied in Frequency Division Duplex, such as on each of the individual uplink and downlink frequencies.

The signal 401 includes a physical layer beacon 410, a control information 420 and a payload 430, which each includes one or more symbols 405 (i.e., a time unit allocation across all frequencies). In one embodiment, the physical layer beacon 410 may be a preamble. The physical layer beacon may include information and/or pilots for use in synchronization, tracking loops, channel estimation and other physical layer procedures. The control information 420 identifies the locations of data within the signal 401 and possibly for subsequent signals. In particular, a WiMAX data frame need not be completely filled with data, but rather can include one or more portions of data uniquely arranged therein. Therefore, the control information 420 identifies the starting and ending positions of the data within the signal 401. The payload 430 can be broken into one or more zones 435, which can each have a corresponding modulation scheme (e.g., space-time coding, space-frequency coding, single antenna transmissions, beam-forming, multiple antenna transmissions, modulation type and/or encoding rate) associated therewith. The data transmitted within the signal 401 is located within the various zones 435 of the payload 430.

Figure 4B:
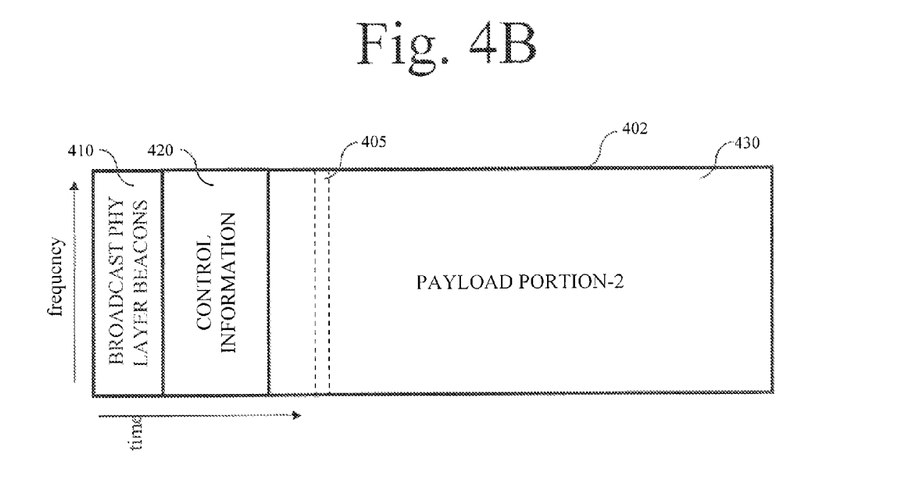
FIG. 4B illustrates a signal received or transmitted by the wireless communication device according to an exemplary embodiment of the invention.

FIG. 4B illustrates another signal 402 received or transmitted by the wireless communication device 300 according to an exemplary embodiment of the invention. The signal 402 generally represents a 3GPP LTE (Long-Term Evolution) data sub-frame. The signal 402 includes a physical layer beacon 410, a control information 420, and a payload portion 430, which each includes one or more symbols 405. The data sub-frame of FIG. 4B is substantially similar to the data frame of FIG. 4A, but does not include distinct zones within its payload portion 430. The invention is not limited to the particular signal types of FIG. 4A and FIG. 4B, as these are provided for example purposes as will be understood by those skilled in the arts.

Referring back to FIG. 3, upon receipt of the signal by the transceiver module 310, the transceiver module 310 immediately begins performing various operations on the signal. In particular, the hardware/software components must first perform a channel estimation using the physical layer beacon 410 of the received signal, and then must demodulate and decode the received signal using the channel estimation. Next, the transceiver module 310 must analyze the control information 420 to determine where data bursts are located within the signal(s). For a WiMAX signal, the software and/or hardware components must also determine where zones begin and end, and to which zones the data bursts are allocated.

After (or while) performing these functions, the transceiver module 310 forwards the results of the determinations to a signal analysis module 322 within the power reduction module 320. The signal analysis module 322 determines, based on the information received from the transceiver module, when the transceiver module can be placed in a low-power state. In other words, the signal analysis module 322 determines when there will be needed information within the received signal that requires the transceiver module to function fully. Portions of time of the received signal that do not include needed information (e.g., data bursts, measurement symbols, etc.) can be ignored, during which time the transceiver module 310 can operate at a low-power state. After determining the operation periods of the transceiver module 310, the signal analysis module 322 forwards the results to the power control module 324.

Figure 5:
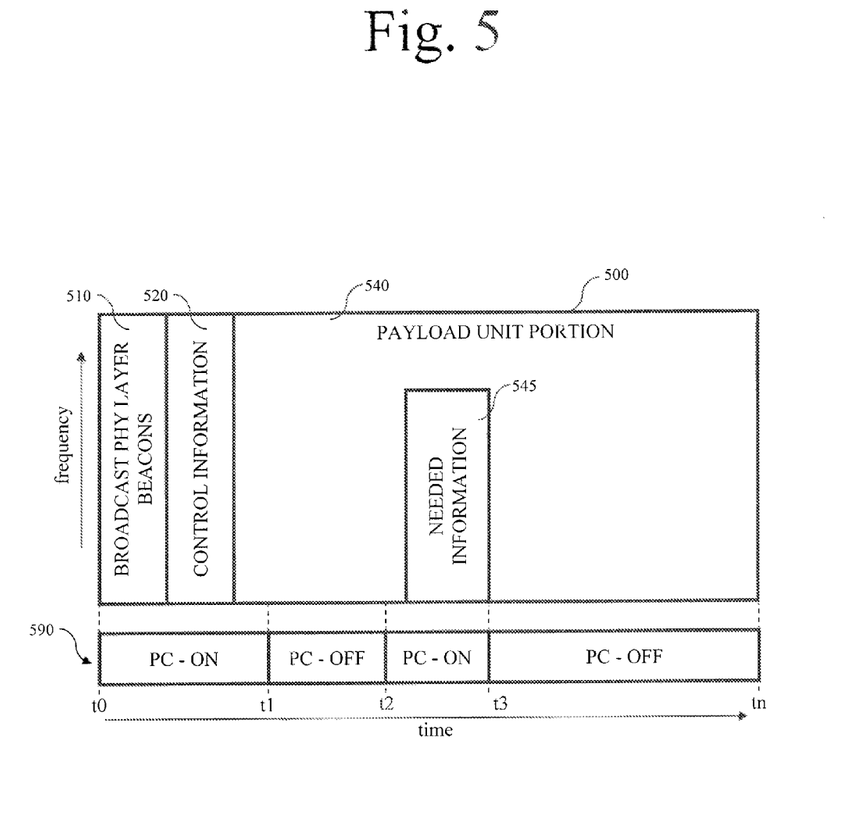
FIG. 5 illustrates a block diagram of a power control scheme that may be implemented by the wireless communication device according to an exemplary embodiment of the invention.

The power control module 324 controls the sections of the hardware module 312 and the sections of the software module 314 to operate in a HIGH power state, or at a LOW power state, at various periods of time during signal reception based on the determinations by the signal analysis module 322, as shown for example in FIG. 5. In an embodiment, the HIGH and LOW power states correspond to the number of receiver antennas operated by the transceiver module 310. In other words, the number of receiver antennas operated in the LOW power state is less than the number of receiver antennas operated in the HIGH power state.

FIG. 5 illustrates a block diagram of a power control scheme 590 associated with a data frame/sub-frame 500 that may be implemented by the wireless communication device 300 according to an exemplary embodiment of the invention.

The power control scheme 590 is performed over the course of a single frame/sub-frame 500 of data within the received signal, and can vary among different frames/sub-frames depending on locations and amounts of needed information, as well as other considerations. The power control scheme 590 begins at time t0 (i.e., the start of the data frame/sub-frame 500). Initially, the transceiver module 310 is powered in a HIGH power state (i.e., full-power state) in order to read and analyze the physical layer beacon 510 and the control information 520 information. Because the processing of the physical layer beacon 510 and control information 520 information will naturally take slightly longer than the time associated with those portions of the frame/sub-frame 500, the power control module 324 will continue to operate the transceiver module 310 in an ON state until time t1, which occurs slightly later than the end of the control information 520 of the received signal.

After completion of the initial processing, the power reduction module 320 has determined the location of needed information 545, such as data bursts for example, within the frame/sub-frame 500 of the received signal. For example, needed information 545 falls in the middle of the frame 500, as shown, and therefore significant portions before and after have no needed information. Therefore, for the period from time t1 (the conclusions of initial processing) to time t2 (before the start of the needed information 545), the power control module 324 controls the transceiver module 310 to operate in a LOW power state.

At time t2, the power control module 324 controls the transceiver module 310 to operate in a HIGH power state in preparation for receiving the needed information 545. The time t2 preferably begins one or more symbols prior to the start of the needed information 545 in order to allow the components within the transceiver module 310 to reach steady-state and/or to perform any preparation operations in anticipation of receiving the needed information 545. This predetermined "wake up" time can be set based on the modulation scheme employed within the sub-frame, or within the corresponding zone of a WiMAX data frame. At time t3, the needed information concludes and the power control module 324 controls the transceiver module 310 to again operate in a LOW power state until time tn, which marks the end of the current frame/sub-frame 500.

Although the above discussion describes the power control scheme for a single burst of needed information for simplicity, the general concepts described therein can be applied to data frames/sub-frames having any number of needed information bursts. In particular, the power control module 324 would control the transceiver module 310 to "wake up" (operate in a HIGH power state) one or more symbols prior to the start of each burst of needed information. The power control module 324 would similarly control the transceiver module 310 to be in a LOW power state at the conclusion of each burst, unless doing so would conflict with another burst or a wake up period for another burst.

Warm Up

As discussed above, the power control module 324 preferably controls the transceiver module 310 to operate in a HIGH power state during a "wake up" period that precedes a burst of needed information 545. However, when the needed information burst 545 resides at the beginning of the data frame/sub-frame 500, a wake up operation cannot always be applied gainfully. Therefore, in these cases the wireless communication device 300 instead performs a "warm up" operation.

When the needed information burst is located at the beginning of the frame/sub-frame 500 (after the physical layer beacon 510 and control information 520), the power control module 324 controls the transceiver module 310 to operate in a HIGH power state during this period. However, rather than decode the data contained within the needed information burst 545 immediately, the wireless communication device 300 instead performs any needed channel estimations or other measurements. Once concluded, the wireless communication device 300 then decodes the needed information burst 545 using the obtained measurements. This can be accomplished by temporarily storing the needed information 545 in a memory and subsequently decoding the stored information after completion of the channel estimation.

DRX and SPS Mode Power Conservation

As discussed above, the power control module 324 should typically control the transceiver module 310 to operate in a HIGH power state during the initialization period (i.e., from time t0-t1). However, certain conditions may allow for the transceiver module 310 to operate in a LOW power state even during this period.

Figure 4C:
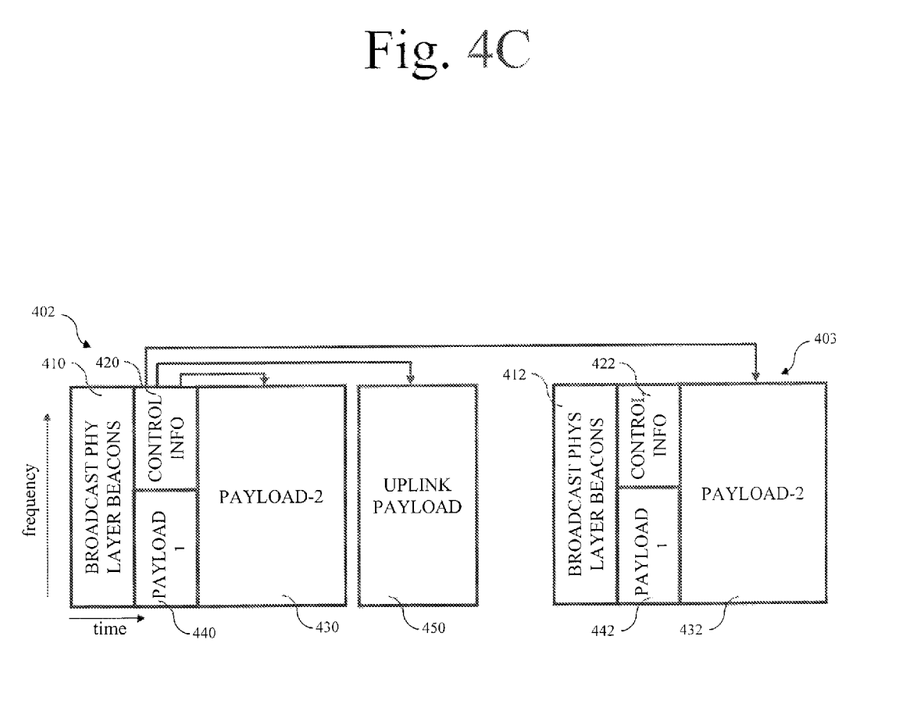
FIG. 4C illustrates a signal received or transmitted by the wireless communication device according to an exemplary embodiment of the invention.

FIG. 4C illustrates a signal received or transmitted by the wireless communication device in a DRX or SPS mode according to an exemplary embodiment of the invention. In particular, LTE wireless communication supports a discontinuous reception (DRX) mode, in which a base station can identify a period of time that the mobile device can expect not to receive any signals. During this inactivity period, the power control module 324 can control the transceiver module 310 to be in a LOW power state. The power control module 324 can then control the transceiver module 310 to be in a HIGH power state at the conclusion of the DRX inactivity period or one or more symbols prior thereto.

As shown in FIG. 4C, the physical beacon 410 may indicate that the wireless communication device 300 should enter DRX mode. In this instance, the wireless communication device decodes the current information contained in payload 1 440 and payload 2 430 based on the control information 420, and responds with any uplink information in the uplink payload 450. The power control module 324 then controls the transceiver module 310 to enter a LOW power state until some future frame 403.

Semi-Persistent Scheduling (SPS) mode is similar to DRX mode. In SPS mode, a base station will identify in one sub-frame the locations to expect data bursts within that sub-frame, as well as in a number of additional subsequent sub-frames. Thus, once the base station has initiated SPS mode, it is no longer necessary to process the physical layer beacons and/or control information portions of those subsequent sub-frames.

As shown in FIG. 4C, the physical beacon 410 may indicate that the wireless communication device 300 should enter SPS mode, and the control information 420 may indicate the location of data within the current and subsequent frames, as well as provide uplink allocations. Consequently, once this information has been decoded, the power control module 324 controls the transceiver module 310 to enter a LOW power state other than when the transceiver module 310 is needed to decode relevant information. In the example of FIG. 4C, presuming that the control information 420 has allocated payload 2 430 and uplink payload 450, the transceiver module 310 operates in a LOW power state during the physical layer 412, payload 1 442 and control information 422 of subsequent frames.

It should be noted that, even in these modes, it may be necessary to frequently process the broadcast physical layer beacons 410 and 412 in order to ensure that the wireless communication device 300 remains connected to the other wireless communication device (e.g., base station) and to tune timing, measurement, and tracking loops used for communication. Consequently, the power control module 324 will need to control the transceiver module 310 to operate in a HIGH power state during those periods physical layer beacon Those skilled in the relevant art(s) will recognize that many modifications may be made to the wireless communication device 300 within the spirit and scope of the present invention. For example, the functions of the signal analysis module 322 can be performed by the transceiver module 310, which is already configured to perform numerous operations with respect to a received signal.

Figure 6:
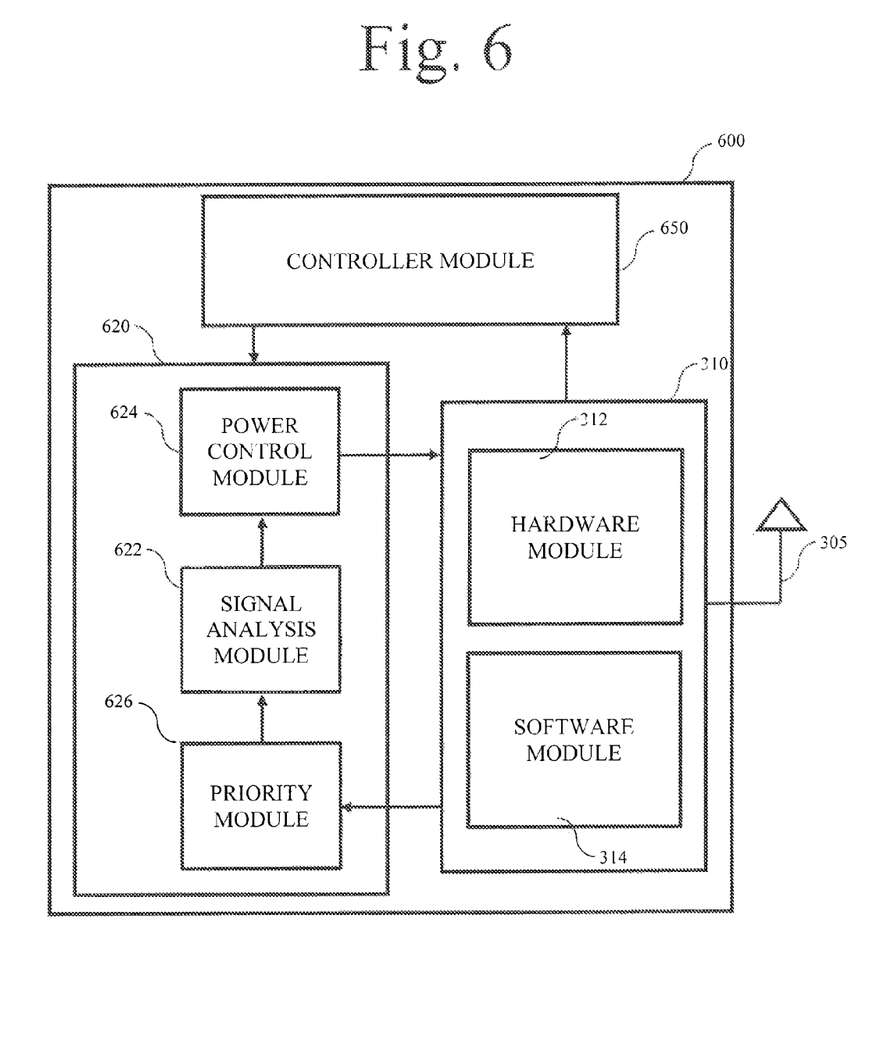
FIG. 6 illustrates a block diagram of a wireless communication device that may be implemented as part of the wireless communication environment according to an exemplary embodiment of the invention.

Exemplary Wireless Communication Device for Optimizing Power Reduction Based on Measurement Type FIG. 6 illustrates a block diagram of a wireless communication device 600 that may be implemented as part of the wireless communication environment 100 according to an exemplary embodiment of the invention. The wireless communication device 600 includes a priority module 626 included within its power reduction module 620, and is capable of selecting a power control scheme for the transceiver module 310 based on a type of measurement to be taken.

During communication with a base station, a mobile device must repeatedly perform various measurements of, for example, channel conditions, signal conditions, etc. These measurements may be used internally within the mobile device, or by the base station to perform various functions. For example, measurements may be used by the base station to determine an optimal encoding scheme for signal communication or to determine whether the mobile device should seek to "hand off" to another base station. Depending on the purpose of a particular measurement, the wireless communication device 600 should select an appropriate power control scheme, as discussed in further detail below. For simplicity of discussion, aspects unrelated to the optimization of the power control schemes based on measurement type will not be discussed, and should be presumed to function substantially the same as their previously-discussed counterparts.

The wireless communication device 600 receives a signal from the wireless communication environment 100 at the transceiver module 310 via the antenna 602. After performing initial processing on the signal, the transceiver module 310 forwards the signal to the priority module 626 within the power reduction module 620. The priority module 626 analyzes the control information of the received signal to determine if the base station has requested a particular measurement and receives signals from a controller module 650 regarding whether isolated measurements can be bypassed. The priority module 626 sets a priority of the measurement based on this received information and forwards the result to the signal analysis module 622. The signal analysis module 622 sets a power control scheme based on the priority set by the priority module 626 and the signal information. The power control module 624 then controls the transceiver module 310 to operate at a HIGH or LOW power state based on the power control scheme.

Figure 7:
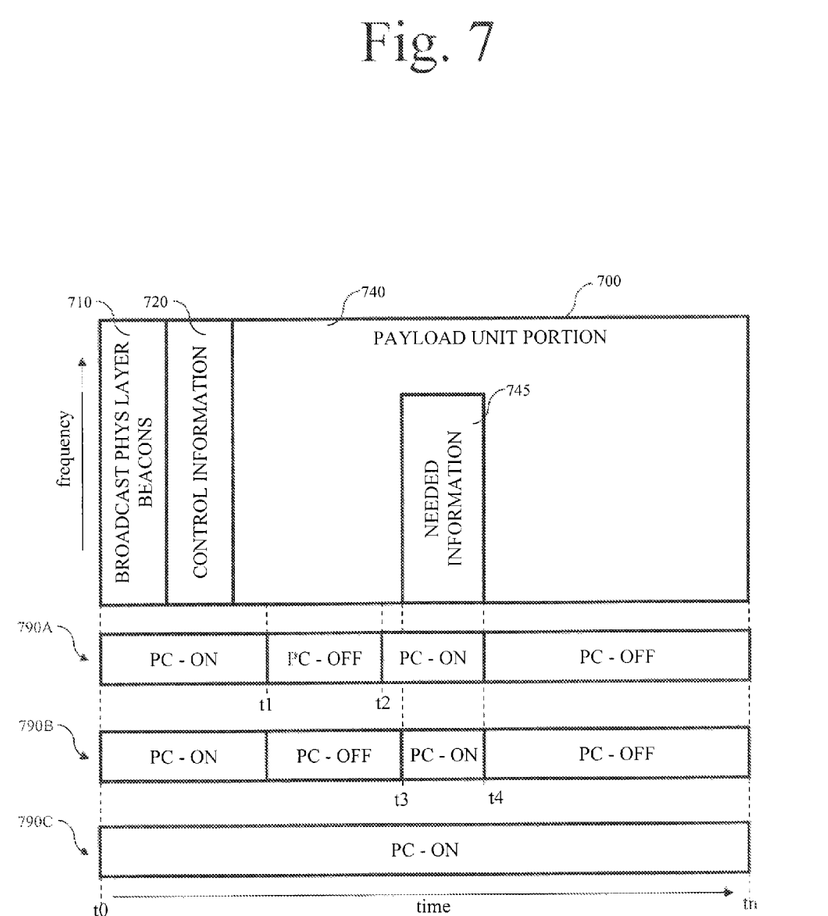
FIG. 7 illustrates a block diagram of a data frame/subframe and power control schemes that may be implemented by the wireless communication device for taking a measurement according to an exemplary embodiment of the invention.

FIG. 7 illustrates a block diagram of a data frame/sub-frame 700 and power control schemes 790 optimized based on a measurement type, which may be implemented by the wireless communication device 600 according to an exemplary embodiment of the invention.

As discussed above, the priority module 626 determines measurement priorities based on whether the control 720 of the frame/sub-frame 700 includes a measurement request by the base station, and whether the priority module 626 receives a signal from the controller module 650 indicating that isolated measurements are unnecessary. If the priority module 626 does not receive either of these two indications, the priority module 626 sets the priority of the measurement to a default priority. As a result, the signal analysis module sets a default power control scheme 790A.

In the default power control scheme 790A, the power control module 624 controls the transceiver module 310 to be in HIGH or LOW power state during an initialization period (time t0-t1) depending on whether it is necessary to decode the physical layer beacon 710 and control information 720 (see above regarding DRX and SPS modes). The power control module 624 additionally controls the transceiver module 310 to be in a HIGH power state during a "wake up" period prior to the needed information 745 (time t2-t3), and to be in a HIGH power state during the needed information 745 (time t3-t4). The power control module 624 controls the transceiver module 310 to operate in a LOW power state during the remainder of the frame/sub-frame 700 (times t1-t2 and t4-tn).

By performing the wake-up operation for the transceiver module 610, the transceiver module 610 is fully-prepared to receive the needed information 745 by time t3. As such, the accuracy of the measurement increases, without requiring the transceiver module 610 to be in a HIGH power state for the entire frame 700.

In addition, isolated measurements (measurements taken during periods of signal inactivity) can also be taken during the wake up period (time t2-t3), and are used internally to properly decode the needed information 745. Because the measurements are taken at a time when the wireless communication device 600 is not also receiving a needed information burst from the received signal, the accuracy of the measurement increases. Further, this approach maximizes power savings because the LOW power state is maximized, given that the "wake-up" period is being used for its intended purpose, and also for isolated measurements. In other words, there is no separate isolated measurement time, which means that the LOW power state is extended.

Alternatively, if the priority module 626 receives a signal from the controller module 650 that isolated measurements are unnecessary, the priority module 626 sets a low priority measurement. This may occur when the controller module 650 determines that channel conditions are substantially unchanging such that it is unnecessary to repeatedly perform measurements, or in other circumstances within the spirit and scope of the present invention. In other words, the priority module 626 determines that high accuracy is not needed, and therefore permits power conservation during symbols where a burst is not present.

Based on the low priority determination, the signal analysis module 622 sets a low-priority power control scheme 790B to be used by the power control module 624 for controlling a power consumption of the transceiver module 310. In the low-priority power control scheme 790B, the power control module 624 operates the transceiver module 310 in a HIGH power state during the initialization period (t0-t1) if necessary, and in a HIGH power state during a period corresponding to the needed information 745 (time t3-t4). The power control module 624 controls the transceiver module 310 to otherwise operate at a LOW power state (times t1-t3 and t4-tn). Consequently, unlike in the default power control scheme 790A, the transceiver module 310 controlled by the low-priority power control scheme 790B is in a LOW power state during the wake up period (time t2-t3).

In this manner, signal measurements are only taken during the time for also receiving the needed information 745. This power control scheme reduces power consumption by eliminating the wake up time period, but may introduce errors as the needed information will be received without exact knowledge of current channel conditions.

Alternatively, if the priority module 626 receives a measurement request from the base station, the priority module 626 sets a high priority measurement. Measurement requests received from the base station are typically to be used for vital communication settings, such as modulation/encoding schemes and hand-off initiations. Consequently, such requests receive top priority among the various measurement types.

Based on the high priority determination, the signal analysis module 622 sets a high-priority power control scheme 790C to be used by the power control module 624 for controlling the power consumption of the transceiver module 310. In the high-priority power control scheme 790C, the power control module 624 operates the transceiver module 310 to be in a HIGH power state during the entire frame/sub-frame 700 (time t0-tn).

In this manner, the wireless communication device 600 ensures accurate measurements for the base station. This power control scheme increases the accuracy of measurements at the cost of power saving.

Those skilled in the relevant art(s) will recognize that many modifications may be made to the wireless communication device 600 and the corresponding power controls schemes 790 within the spirit and scope of the present invention. For example, although the wireless communication device 600 was described with respect to only a single burst of needed information 745, those skilled in the relevant art(s) will recognize that the rules described with respect to the different power control schemes 790 would similarly be applied to multiple bursts of needed information within one or more frames/sub-frames. In addition, the exact durations of the HIGH/LOW power states of the transceiver module 310 can be modified in accordance with the spirit and scope of the present invention. For example, rather than eliminating the wake up period in the low priority control scheme, it could merely be shortened, and rather than requiring an entirely HIGH power state in the high priority control scheme, the warm up period could simply be extended.

In addition, although the above discussions describe only the power control of the transceiver module 310, and only discusses two levels of power consumption (i.e., HIGH and LOW), the same concepts described above may be applied to multiple components within the wireless communication device at multiple power levels. For example, the power control module 324/624 may also control the power consumption of the controller module 350/650 and the signal analysis module 322/622, and may control any of the components to operate at any power level among a range of permissible power levels (e.g., OFF, LOW, MED, HIGH, etc.). Further, each component may be controlled to operate at the same or different power levels as other components.

Figure 8:
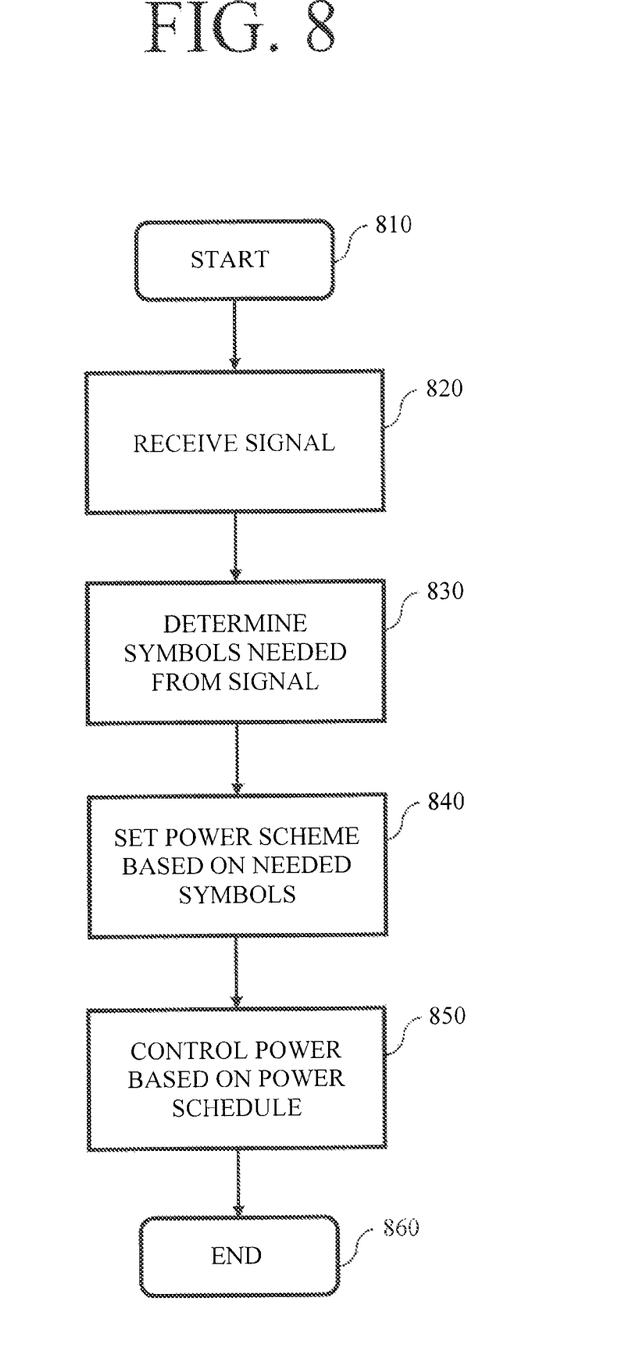
FIG. 8 illustrates a block diagram of a method for reducing power consumption in a wireless communication device according to an exemplary embodiment of the invention.

An Exemplary Method of Reducing Power Consumption within a Wireless Communication Device FIG. 8 illustrates a block diagram of a method for reducing power consumption in a wireless communication device according to an exemplary embodiment of the invention.

The method begins at step 810 and immediately proceeds to step 820. In step 820, the wireless communication device receives a signal from the wireless communication environment via its transceiver module. The signal includes one or more data frames/sub-frames that each contain a plurality of symbols. The method then proceeds to step 830. In step 830, the wireless communication device analyzes the received signal to determine which symbols contain needed information, and which symbols can be ignored. The method then proceeds to step 840.

In step 840, the wireless communication device sets a power control scheme for its transceiver module based on the locations of needed symbols within the data frame/sub-frame. The power scheme is preferably set in such a way as to place the transceiver module in a HIGH power state during the periods of time corresponding to symbols containing needed information and during a predetermined number of symbols prior to the needed information symbols, and to place the transceiver module in a LOW power state during remaining periods of time. The method then proceeds to step 850. In step 850, a power control module of the wireless communication device controls the transceiver module in accordance with the set power scheme. The method then proceeds to step 860, where the method ends.

Those skilled in the relevant art(s) will recognize that the method can additionally or alternatively include any of the functionality of the wireless communication device 300 discussed above, and the above description of the exemplary method should neither be construed to limit the method nor the description of the wireless communication device 300.

Figure 9:
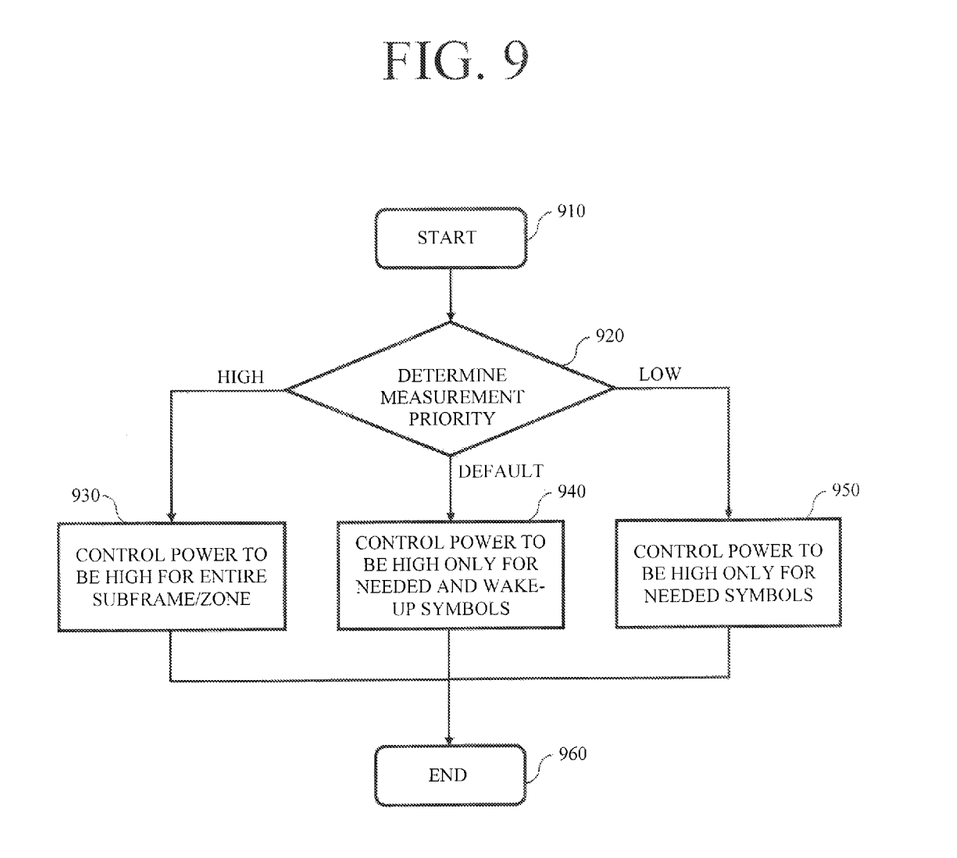
FIG. 9 illustrates a block diagram of a method for controlling power consumption in a wireless communication device during measurement according to an exemplary embodiment of the invention.

An Exemplary Method of Optimizing Power Consumption within Wireless Communication Device Based on Measurement Priority FIG. 9 illustrates a block diagram of a method for optimizing power consumption in a wireless communication device based on measurement priorities according to an exemplary embodiment of the invention.

The method begins at step 910 and immediately proceeds to step 920. In step 920, the wireless communication device determines a priority of a measurement to be taken within or across a frame/sub-frame of a received signal. The measurement can be classified as low-priority, high-priority, or default priority, based on several factors, including whether a measurement request was received from the base station for a particular measurement and/or a rate of change of channel conditions.

If the wireless communication device determines the measurement to be high-priority, the method proceeds to step 930. In step 930, the wireless communication device controls the transceiver module to operate in a HIGH power state during an entire frame/sub-frame of the received signal. This sacrifices power, but increases measurement accuracy.

Alternatively, if the wireless communication device determines the measurement to have default priority (neither high nor low priority), the method proceeds to step 940. In step 940, the wireless communication device controls the transceiver module to be in a HIGH power state only during data symbols of the frame/sub-frame that contain needed information, and for a predetermined number of wake up symbols preceding the needed information. The signal transceiver otherwise operates in a LOW power state.

Alternatively, if the wireless communication device determines the measurement to be low priority, the method proceeds to step 950. In step 950, the wireless communication device controls its transceiver module to be on only for symbols of the frame/sub-frame that contain the needed information, without a wake up period. The transceiver module otherwise operates in a LOW power state.

The method then proceeds to step 960, where the method ends.

Those skilled in the relevant art(s) will recognize that the method can additionally or alternatively include any of the functionality of the wireless communication device 600 discussed above, and the above description of the exemplary method should neither be construed to limit the method nor the description of the wireless communication device 600.

The representative signal processing and control functions described herein (e.g. signal analysis and power control, etc.) can be implemented in hardware, software, or some combination thereof. For instance, the signal processing and power control functions can be implemented using computer processors, computer logic, application specific circuits (ASIC), digital signal processors, etc., as will be understood by those skilled in the arts based on the discussion given herein. Accordingly, any processor that performs the signal processing functions described herein is within the scope and spirit of the present invention.

Further, the signal processing and control functions described herein could be embodied by computer program instructions that are executed by a computer processor or any one of the hardware devices listed above. The computer program instructions cause the processor to perform the signal processing functions described herein. The computer program instructions (e.g. software) can be stored in a computer usable medium, computer program medium, or any storage medium that can be accessed by a computer or processor. Such media include a memory device such as a RAM or ROM, or other type of computer storage medium such as a computer disk or CD ROM, or the equivalent. Accordingly, any computer storage medium having computer program code that cause a processor to perform the signal processing functions described herein are within the scope and spirit of the present invention.

CONCLUSION

It is to be appreciated that the Detailed Description section, and not the Abstract section, is intended to be used to interpret the claims. The Abstract section may set forth one or more, but not all exemplary embodiments, of the invention, and thus, are not intended to limit the invention and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the following claims and their equivalents.

What is claimed is:

1. A wireless communication device, comprising:
a receiver module configured to receive a signal;
a power reduction module configured to reduce a power consumption of the receiver module based on the received signal, the power reduction module including:
  a signal analysis module configured to decode a control information portion of the received signal associated with a control information time period in the received signal, and to determine a location of needed information in the received signal based on decoded control information; and
  a power control module configured to control the receiver module to operate in a HIGH power state during a time period that includes an entirety of the associated control information time period and an additional time period immediately after the control information time period, and during an information time period corresponding to the location of the needed information, and to control the receiver module to operate in a LOW power state during another time period of the received signal;
  a measurement module configured to measure a signal characteristic; and
  a decoder module configured to decode the needed information based on the measured signal characteristic;
  wherein when the needed information is separated from the control information portion by a predetermined delay, the measurement module is configured to measure the signal characteristic based only on wake-up signals received during a second period of time that immediately precedes the needed information, and
  wherein when the needed information is separated from the control information portion by less than the predetermined delay, the measurement module is configured to measure the signal characteristic after the information time period.

2. The wireless communication device of claim 1, wherein the LOW power state consumes less power than the HIGH power state.

3. The wireless communication device of claim 2, wherein the receiver module is powered off during the LOW power state.

4. The wireless communication device of claim 2, wherein the power control module further controls the receiver module to operate in the HIGH power state while the signal analysis module performs the decoding and determining.

5. The wireless communication device of claim 2, wherein the power control module is configured to control the receiver module to operate in the LOW power state during time periods other than the time period corresponding to the location of the needed information within a payload portion of the received signal.

6. The wireless communication device of claim 5, wherein the control information portion of the received signal includes a physical layer beacon and control information,
wherein at least one of the physical layer beacon and the control information identifies locations of data bursts contained within the payload portion, and
wherein the time period corresponding to the location of the needed information includes time periods corresponding to the locations of the data bursts.

7. The wireless communication device of claim 6, wherein the time period corresponding to the location of the needed information further includes the second period of time.

8. The wireless communication device of claim 7, wherein a duration of the second period of time depends on a modulation scheme associated with the received signal.

9. The wireless communication device of claim 7, wherein the received signal further includes a plurality of zones that each have a corresponding modulation scheme, and
a duration of the second period of time is set for each zone based on the corresponding modulation scheme.

10. The wireless communication device of claim 9, wherein the predetermined delay is defined by a size of the second time period.

11. The wireless communication device of claim 10, wherein the power control module controls the receiver module to operate in a HIGH power state during the measurement and the decoding.

12. The wireless communication device of claim 8, wherein the second period of time is a minimum amount of time needed to make a channel estimation.

13. The wireless communication device of claim 8, wherein the measured signal characteristic is a channel estimation, and
when the needed information is separated from the control information portion by the predetermined delay the measurement module performs the channel estimation during the second period of time, and the receiver module uses the channel estimation to decode the data bursts.

14. The wireless communication device of claim 2, wherein the power reduction module further includes a priority module configured to determine a priority of a measurement to be performed by the receiver module.

15. The wireless communication device of claim 14, wherein, if the priority module determines that the measurement is high-priority, the power control module controls the receiver module to operate in a HIGH power state for an entire sub-frame of the signal.

16. The wireless communication device of claim 14, wherein, if the priority module determines that the measurement is low-priority, the power control module controls the receiver module to operate in a HIGH power state only during an initialization period and during at least one data burst.

17. The wireless communication device of claim 14, wherein, if the priority module determines that the measurement is neither high-priority nor low-priority, the power control module controls the receiver module to operate in a HIGH power state during an initialization period, during at least one data burst, and during predetermined wake up periods preceding each data burst.

18. A method for reducing power in a wireless communication device, comprising:
  receiving a signal by a receiver module;
  decoding a control information portion of the received signal;
  determining a location of needed information that require the receiver module to operate in a HIGH power state in the received signal based on decoded control information;
  controlling the receiver module to operate in the HIGH power state during an entirety of an information period of time corresponding to the location of the needed information and an additional period of time within a payload portion of the received signal, the additional period of time located at the beginning of the payload portion, and to operate in a LOW power state during remaining periods of time in the payload portion of the received signal;
  measuring a signal characteristic, including:
    when the needed information is separated from the control information portion by a predetermined delay, measuring the signal characteristic based only on wake-up signals received during a second period of time that immediately precedes the needed information, and
    when the needed information is separated from the control information portion by less than the predetermined delay, measuring the signal characteristic after the information period of time; and
  decoding the needed information based on the measured signal characteristic.

19. The wireless communication device of claim 2, wherein the receiver module includes a plurality of receiver antennas, and
  wherein a first number of receiver antennas operated in the LOW power state is less than a second number of receiver antennas operated in the HIGH power state.

20. The wireless communication device of claim 7, wherein a length of the second period of time is defined based on an amount of time needed for the receiver module to reach steady state.

* * * * *